(12) United States Patent
Yoo

(10) Patent No.: US 9,391,273 B1
(45) Date of Patent: Jul. 12, 2016

(54) ELECTRONIC DEVICE AND METHOD FOR FABRICATING THE SAME

(71) Applicant: SK hynix Inc., Icheon (KR)

(72) Inventor: Myoung-Sul Yoo, Icheon-si (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/873,135

(22) Filed: Oct. 1, 2015

(30) Foreign Application Priority Data

May 14, 2015 (KR) .......................... 10-2015-0067198

(51) Int. Cl.
*H01L 45/00* (2006.01)
(52) U.S. Cl.
CPC .......... *H01L 45/146* (2013.01); *H01L 45/1233* (2013.01); *H01L 45/1253* (2013.01); *H01L 45/1608* (2013.01)
(58) Field of Classification Search
None
See application file for complete search history.

(56) References Cited

U.S. PATENT DOCUMENTS

| 2011/0175051 A1* | 7/2011 | Song | H01L 45/04 257/4 |
|---|---|---|---|
| 2015/0207069 A1* | 7/2015 | Cho | H01L 45/146 257/4 |

FOREIGN PATENT DOCUMENTS

| KR | 10-2009-0006436 A | 1/2009 |
|---|---|---|
| KR | 10-2013-0076449 A | 7/2013 |

* cited by examiner

*Primary Examiner* — Joseph Schoenholtz

(57) ABSTRACT

Provided is an electronic device including a semiconductor memory. The semiconductor memory includes a first metal oxide layer disposed over a substrate and including a trench therein, a second metal oxide layer disposed along an inner wall of the trench, a selector disposed over the second metal oxide layer and buried in a part of the trench, and a top electrode disposed over the selector.

26 Claims, 22 Drawing Sheets

ELECTRONIC DEVICE AND METHOD FOR FABRICATING THE SAME

CROSS-REFERENCE TO RELATED APPLICATIONS

The present application claims priority of Korean Patent Application No. 10-2015-0067198, entitled "ELECTRONIC DEVICE AND METHOD FOR FABRICATING THE SAME" and filed on May 14, 2015, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device including a semiconductor memory capable of improving the characteristics of a variable resistance element.

In an implementation, there is provided an electronic device including a semiconductor memory. The semiconductor memory may include: a first metal oxide layer disposed over a substrate and including a trench therein; a second metal oxide layer disposed along an inner wall of the trench; a selector disposed over the second metal oxide layer and buried in a part of the trench; and a top electrode disposed over the selector.

The first metal oxide layer comprises a material having lower thermal conductivity than the selector. The first and second metal oxide layers have different oxygen contents from each other. The first metal oxide layer satisfies a stoichiometric ratio. The first metal oxide layer comprises any one of titanium oxide, tantalum oxide, hafnium oxide, nickel oxide, and a combination thereof. The second metal oxide layer contains an insufficient amount of oxygen with respect to a stoichiometric ratio. The second metal oxide layer comprises tantalum oxide or titanium oxide. The selector comprises MIT (Metal Insulator Transition) of OTS (Ovonic Threshold Switch). The selector comprises niobium oxide or vanadium oxide. The electronic device wherein the semiconductor memory may further comprise an anti-diffusion layer or an intermediate electrode disposed between the second metal oxide layer and the selector. The anti-diffusion layer comprises a material layer containing carbon. The intermediate electrode comprises metal nitride. The top electrode comprises metal nitride. The electronic device wherein the semiconductor memory may further comprise a bottom electrode disposed between the substrate and the first metal oxide layer, and wherein the bottom electrode comprises a plurality of conductive lines extending in a first direction and arranged at predetermined intervals from each other. The electronic device wherein the semiconductor memory may further comprise a bottom electrode disposed between the substrate and the first metal oxide layer; and a metal line disposed over the top electrode and the first and second metal oxide layers, wherein the metal line comprises a plurality of conductive lines extending in a second direction crossing the bottom electrode and arranged at predetermined intervals from each other. The electronic device wherein the semiconductor memory may further comprises a bottom electrode disposed between the substrate and the first metal oxide layer; and a metal line disposed over the top electrode and the first and second metal oxide layers, wherein the trench has a hole type, and is disposed in a region where the bottom electrode and the metal line cross each other.

The electronic device may further comprising a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

The electronic device may further comprising a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

The electronic device may further comprising a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

The electronic device may further comprising a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

The electronic device may further comprising a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

In an implementation, there is provided a method for fabricating an electronic device including a semiconductor memory. The method comprising: forming a first metal oxide layer over a substrate; forming a trench in the first metal oxide layer by partially etching the first metal oxide layer; forming a second metal oxide layer along an inner wall of the trench; forming a selector over the second metal oxide layer by filling a part of the trench; and forming a top electrode over the selector.

The first metal oxide layer comprises a metal having lower thermal conductivity than the selector. The first and second metal oxide layers have different oxygen contents from each other. The first metal oxide layer satisfies a stoichiometric ratio. The first metal oxide layer comprises any one of titanium oxide, tantalum oxide, hafnium oxide, nickel oxide, and a combination thereof. The second metal oxide layer contains an insufficient amount of oxygen with respect to a stoichiometric ratio. The second metal oxide layer comprises tantalum oxide or titanium oxide. The selector comprises MIT and OTS. The method may further comprise forming an anti-diffusion layer between the second metal oxide layer and the selector, before forming the selector. The method may further comprise forming an intermediate electrode between the second metal oxide layer and the selector, before forming the selector.

BRIEF DESCRIPTION OF THE DRAWINGS

FIGS. 2A to 9A are cross-sectional views illustrating a method for fabricating the semiconductor device of FIG. 1 in accordance with an implementation.

FIGS. 2B to 9B are plan views illustrating the method for fabricating the semiconductor device of FIG. 1 in accordance with the implementation.

DETAILED DESCRIPTION

Figure 1:
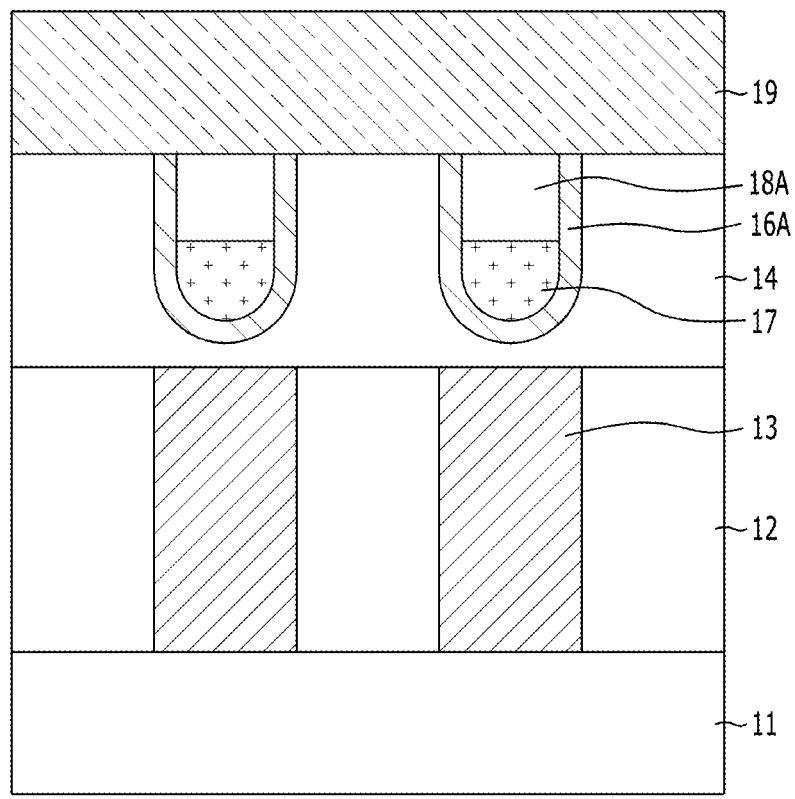
FIG. 1 and FIG. 1A are cross-sectional views of semiconductor devices in accordance with implementations.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view of a semiconductor device in accordance with an implementation.

As illustrated in FIG. 1, a memory cell in accordance with the implementation may include a bottom electrode 13, a first metal oxide layer 14, a second metal oxide layer 16A, a selector 17, a top electrode 18A, and a metal line 19.

The bottom electrode 13 may include a conductive line extending in a first direction over a substrate 11. A plurality of conductive lines, i.e., a plurality of bottom electrodes 13, may be arranged at predetermined intervals from each other. The bottom electrodes 13 may be isolated from each other by a first interlayer dielectric layer 12. The bottom electrode 13 may serve to supply a voltage or current to each cell structure. The bottom electrode 13 may include metal, metal nitride, polysilicon doped with an impurity, or a combination thereof.

The first interlayer dielectric layer 12 may include any of various insulating materials such as oxide and nitride.

The first metal oxide layer 14 may include a plurality of hole-type U-shaped trenches therein. Each of the trenches may be positioned in a region where the bottom electrode 13 and the metal line 19 overlap each other. The first metal oxide layer 14 may serve as an insulating layer to separate the bottom electrode 13 from the metal line 19. Simultaneously, the first metal oxide layer 14 may serve as a variable resistance material layer together with the second metal oxide layer 16A at a contact part between the first and second metal oxide layers 14 and 16A.

The first metal oxide layer 14 may include a material which satisfies a stoichiometric ratio. The first metal oxide layer 14 may include a material having lower thermal conductivity than the selector 17. The first metal oxide layer 14 may include any of titanium oxide, tantalum oxide, hafnium oxide, nickel oxide and the like.

The second metal oxide layer 16A may be formed along an inner wall of the trench disposed in the first metal oxide layer 14. The second metal oxide layer 16A may include a metal oxide which contains oxygen vacancies and has a resistance value changing by the behavior of the oxygen vacancies. The second metal oxide layer 16A may include a material which contains an insufficient amount of oxygen with respect to the stoichiometric ratio. The second metal oxide layer 16A may include titanium oxide ($TiO_x$, x<2) or tantalum oxide ($TaO_y$, y<2.5).

The contact part between the first and second metal oxide layers 14 and 16A may serve as a variable resistance material layer of the memory cell. The variable resistance material layer may switch between a low-resistance state and a high-resistance state, depending on whether or not oxygen vacancies of the second metal oxide layer 16A are supplied to the first metal oxide layer 14 and thus a filament current path is formed in the first metal oxide layer 14 by the oxygen vacancies.

Figure 1A:
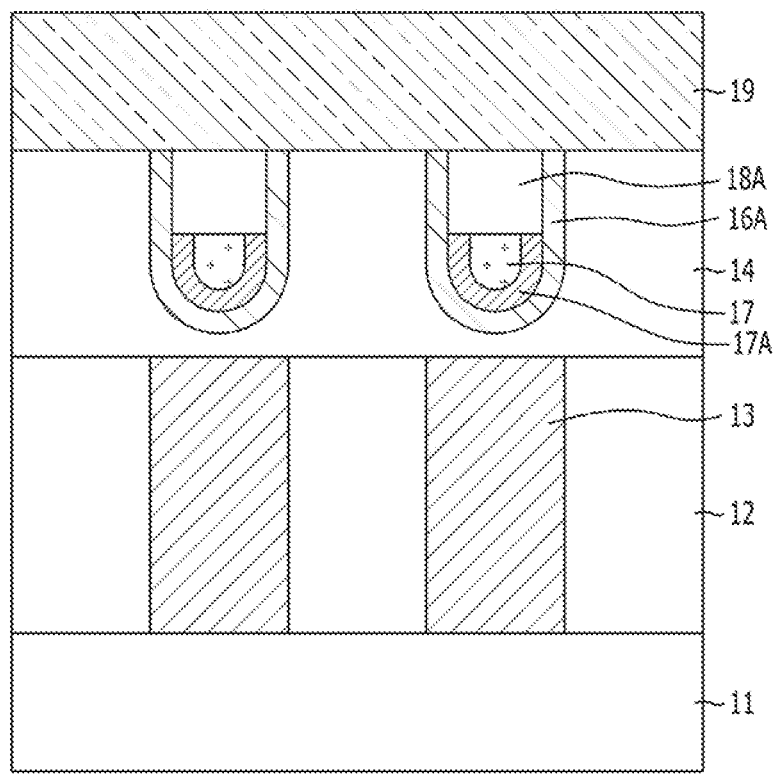

Referring to FIG. 1A, an anti-diffusion layer or intermediate electrode 17A may be additionally formed between the second metal oxide layer 16A and the selector 17. The anti-diffusion layer may include a material layer containing carbon. The intermediate electrode may include the same material as the top electrode 18A. For example, the intermediate electrode may include a metal nitride.

The selector 17 may be formed on the second metal oxide layer 16A so as to fill a part, e.g., a lower portion, of the trench. Since the selector 17 is surrounded by the first metal oxide layer 14 having relatively low thermal conductivity, thermal disturbance can be prevented. The selector 17 may include any one of selecting elements such as MIT (Metal Insulator Transition) and OTS (Ovonic Threshold Switch). When a current flows through the MIT, Joule heat may be generated. Thus, the MIT can be switched at a specific threshold voltage. In particular, the MIT may be used as a selecting element in a cross-point cell array. In this implementation, a sneak current flowing through an unselected cell may be effectively suppressed. The MIT may include a material having a resistance value rapidly changing while the material transitions from an insulating state to a conductive state or from the conductive state to the insulating state due to a change in a crystal structure thereof at a specific critical temperature. The material may include niobium oxide or vanadium oxide. The OTS may include a chalcogenide material. The OTS may include any one selected from the group consisting of Te, Se, Ge, Si, As, Ti, S, and Sb, or a combination of two or more selected from the group.

The top electrode 18A may be positioned over the selector 17. The top electrode 18A may be buried in the other part, e.g., an upper portion, of the trench. The top electrode 18A may include a metal nitride.

The metal line 19 may include a conductive line extending in a second direction crossing the first direction. A plurality of metal lines 19 may be arranged at predetermined intervals from each other. The metal lines 19 may be isolated from each other by a second interlayer dielectric layer that is not shown in FIG. 1. The metal line 19 may include metal, metal nitride, polysilicon doped with an impurity, or a combination thereof.

FIGS. 2A to 9A are cross-sectional views illustrating a method for fabricating the semiconductor device of FIG. 1 in accordance with an implementation, and FIGS. 2B to 9B are plan views illustrating the method for fabricating the semiconductor device of FIG. 1 in accordance with the implementation. In order to promote understanding, the method for fabricating the semiconductor device of FIG. 1 will be described with reference to the cross-sectional views together with the plan views. In the plan views, a solid line indicates a structure of the uppermost layer, and a dotted line indicates a structure disposed under the uppermost layer and thus unexposed.

Figure 2A:
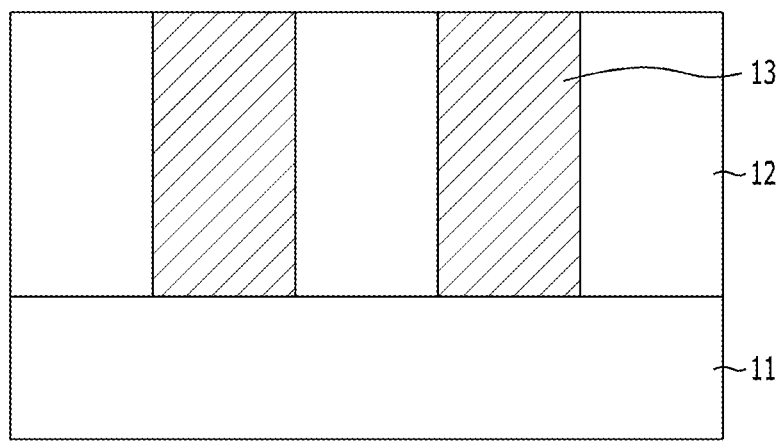
Figure 2B:
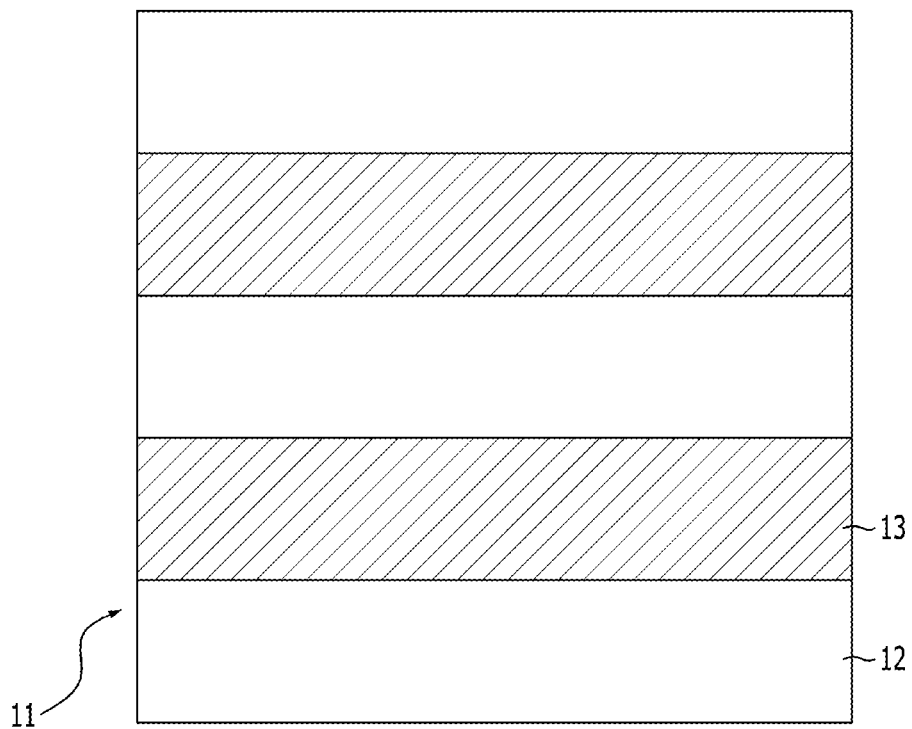

As illustrated in FIGS. 2A and 2B, the first interlayer dielectric layer 12 may be formed over the substrate 11. The first interlayer dielectric layer 12 may include any of various insulating materials such as oxide and nitride.

Then, a plurality of bottom electrodes 13 may be formed to penetrate through the first interlayer dielectric layer 12 so as to be connected to the substrate 11. The bottom electrodes 13 may include a conductive lines extending in a first direction and arranged at predetermined intervals from each other. The bottom electrodes 13 are separate from each other by the first interlayer dielectric layer 12. Accordingly, as shown in FIG. 2B, the bottom electrodes 13 and parts of the first interlayer dielectric layer 12 are alternately arranged in a second direction crossing the first direction.

Figure 3A:
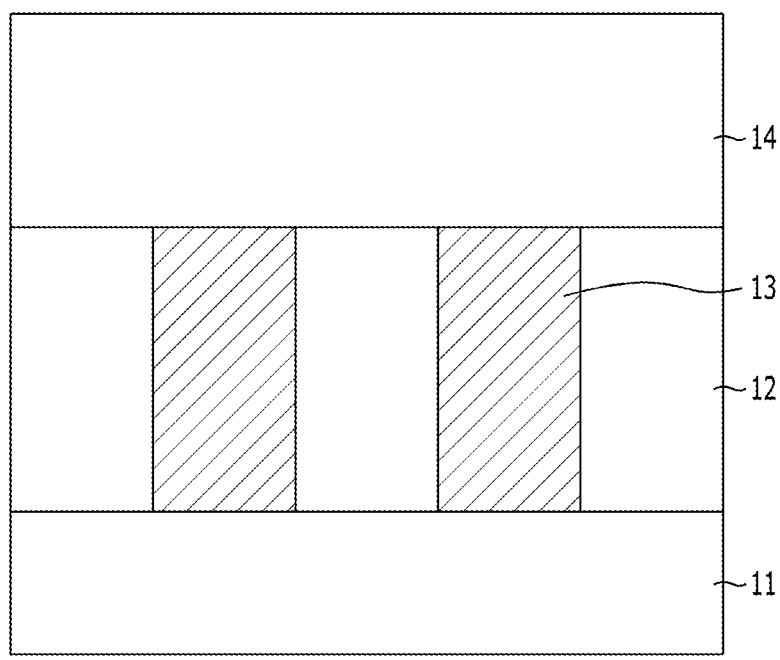
Figure 3B:
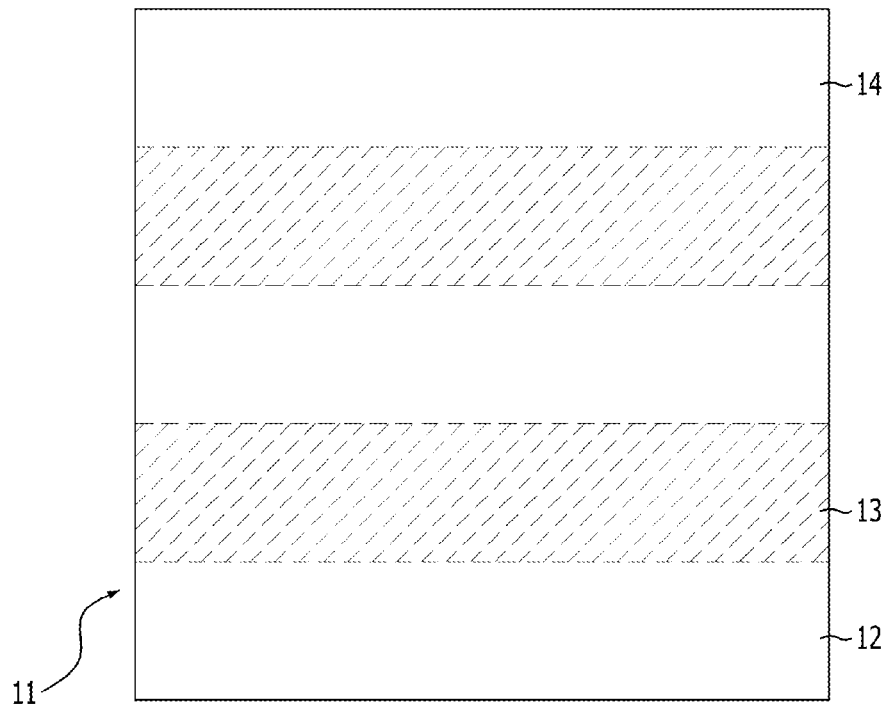

As illustrated in FIGS. 3A and 3B, the first metal oxide layer 14 may be formed on the entire surface of a resultant structure including the bottom electrodes 13 and the first interlayer dielectric layer 12. The first metal oxide layer 14 may serve as an interlayer dielectric layer between the bottom electrodes 13 and metal lines to be formed through a subsequent process. The first metal oxide layer 14 may also serve as a variable resistance material layer together with a second metal oxide layer to be formed through a subsequent process. In particular, the first metal oxide layer 14 may include a material having lower thermal conductivity than a selector to be formed through a subsequent process. Thus, the first metal oxide layer 14 may prevent thermal disturbance of the selector.

Figure 4A:
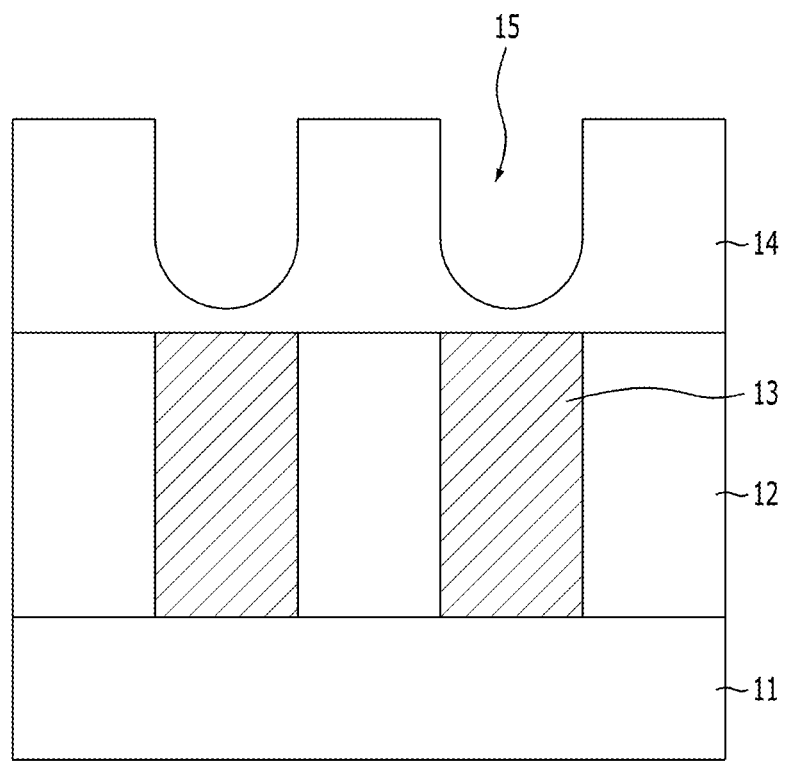
Figure 4:
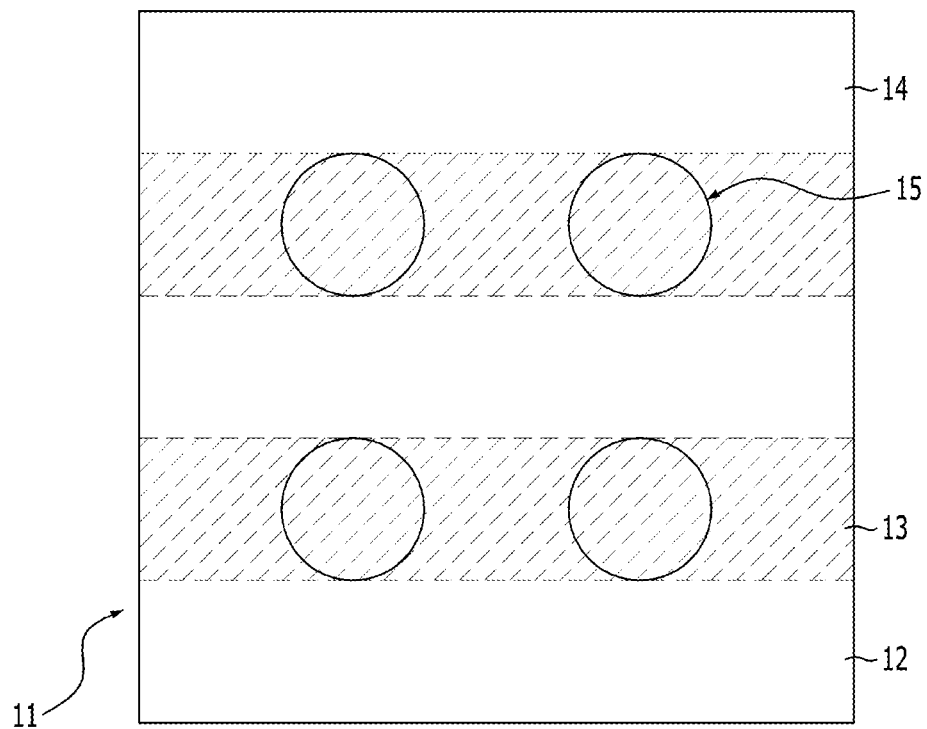

As illustrated in FIGS. 4A and 4B, a plurality of U-shaped trenches 15 may be formed in the first metal oxide layer 14. The U-shaped trench 15 may be formed in a hole type and positioned to overlap the bottom electrode 13. In particular, the trench 15 may be disposed in a region where the bottom electrode 13 and the metal line to be formed cross each other.

The shape of the trench 15 is not limited thereto, but may include any of various shapes.

Figure 5A:
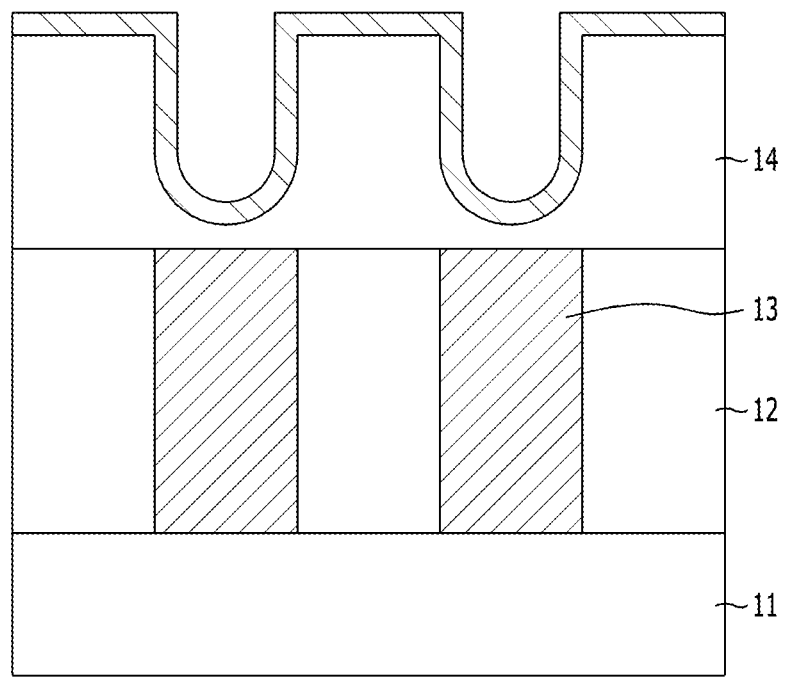
Figure 5B:
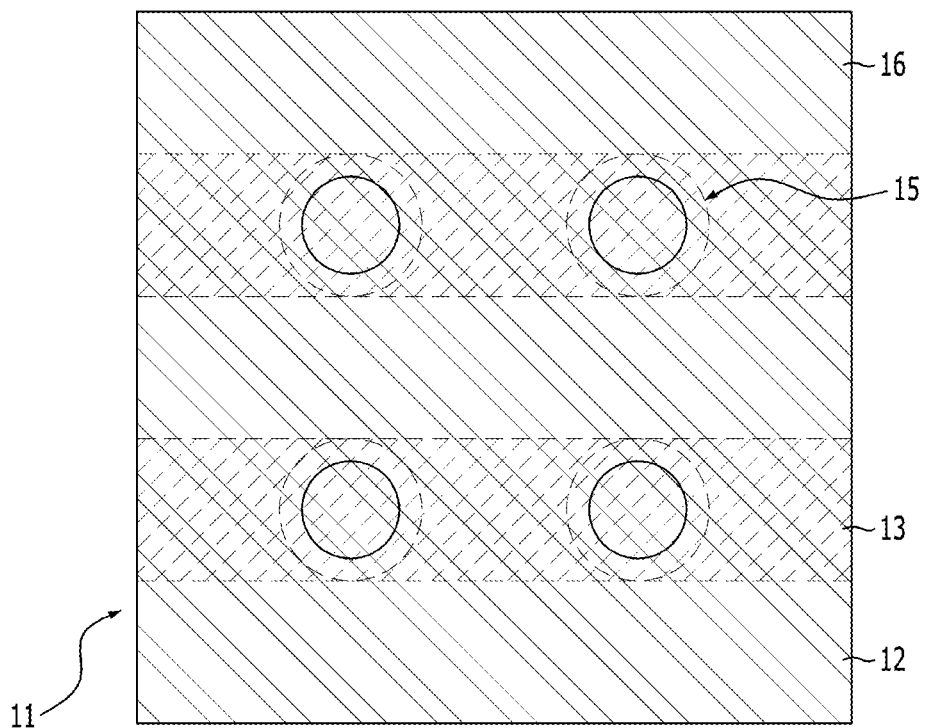

As illustrated in FIGS. 5A and 5B, a second metal oxide layer 16 may be formed along the entire profile of a resultant structure including the trenches 15. The second metal oxide layer 16 may serve as a variable resistance material layer together with the first metal oxide layer 14. The second metal oxide layer 16 may include a material which contains an insufficient amount of oxygen with respect to the stoichiometric ratio.

Figure 6A:
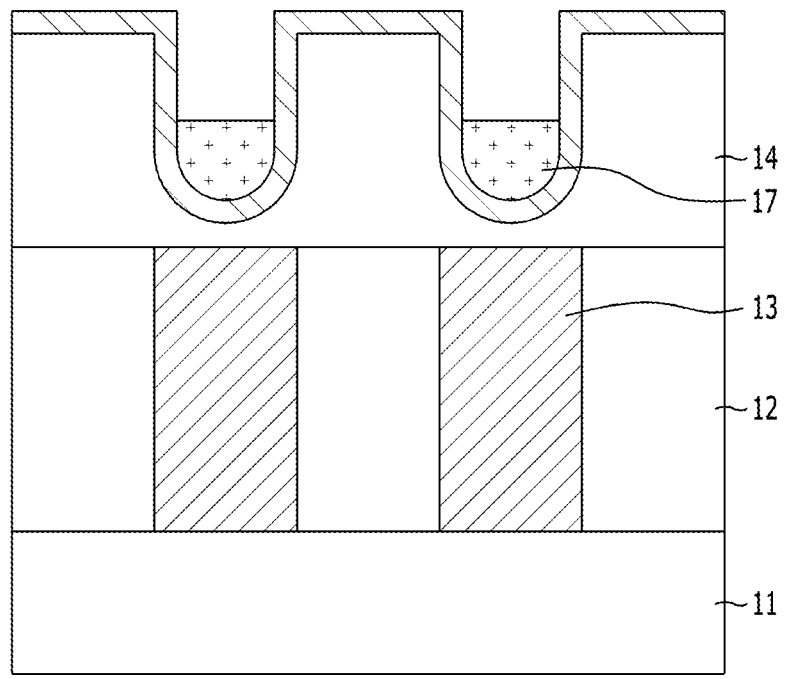
Figure 6:
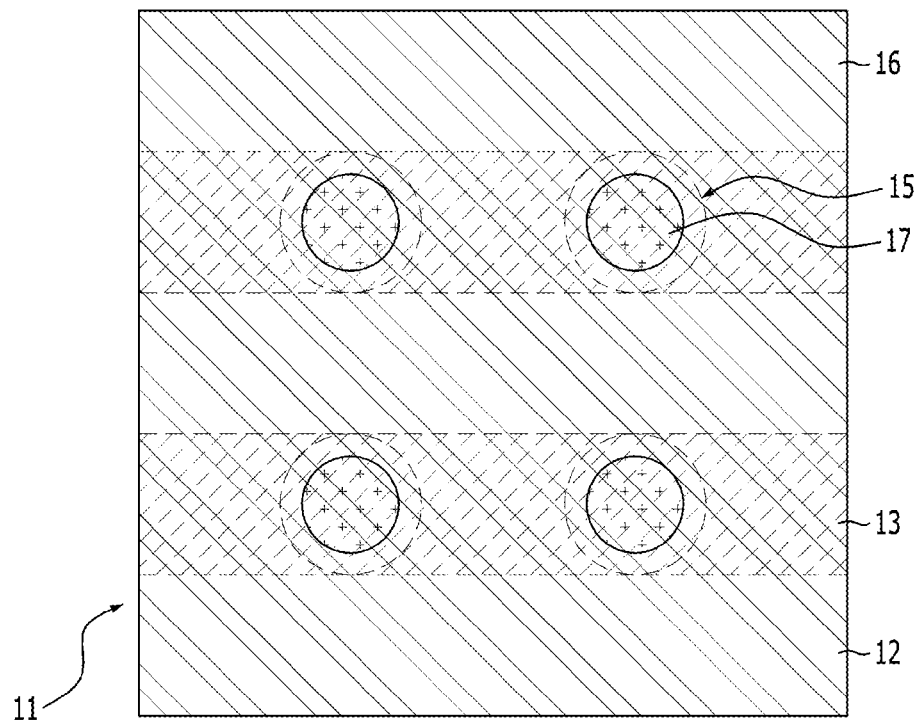

As illustrated in FIGS. 6A and 6B, the selector 17 may be formed over the second metal oxide layer 16 so as to fill a part, e.g., a lower portion, of the trench 15. Since the selector 17 is surrounded by the first metal oxide layer 14 having relatively low thermal conductivity, thermal disturbance can be prevented. The selector 17 may include any one of selecting elements such as MIT (Metal Insulator Transition) and OTS (Ovonic Threshold Switch).

In the present implementation, the selector 17 may be directly formed over the second metal oxide layer 16, but implementations are not limited thereto. In other implementations, an anti-diffusion layer or an intermediate electrode may be additionally formed between the second metal oxide layer 16 and the selector 17.

Figure 7A:
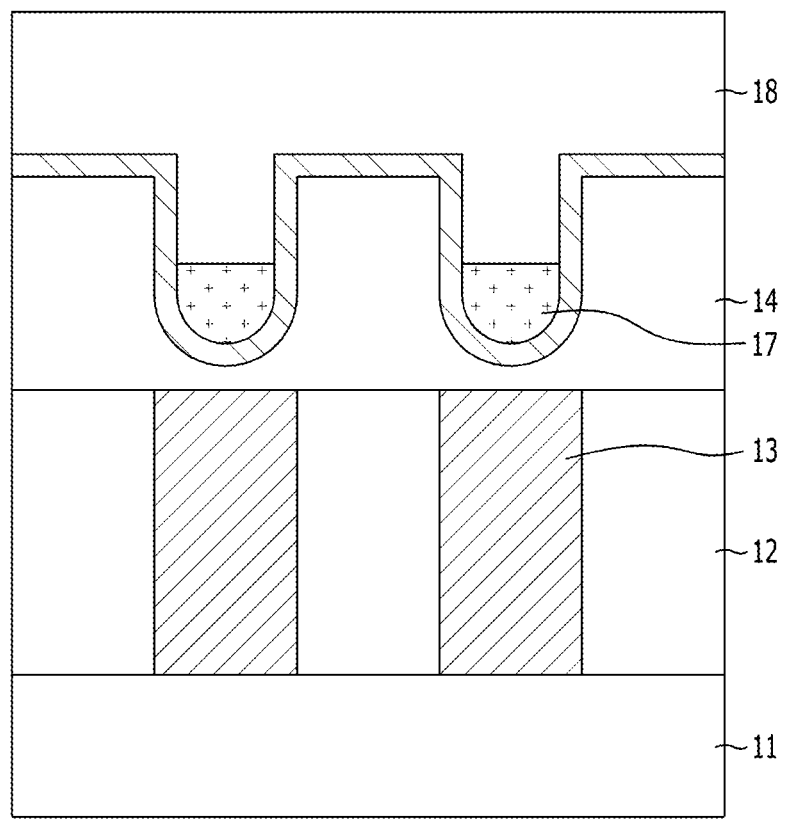
Figure 7B:
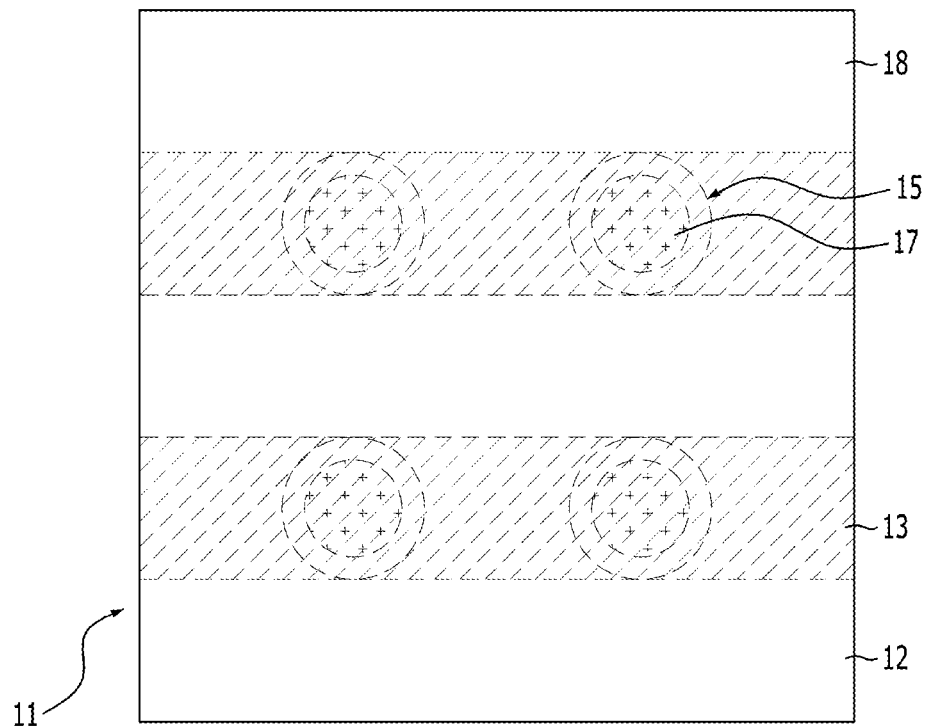

As illustrated in FIGS. 7A and 7B, a conductive material layer 18 may be formed to cover a resultant structure including the selector 17. The conductive material layer 18 may be formed to have a thickness sufficiently filling the other part, e.g., an upper portion, of the trench 15.

Figure 8A:
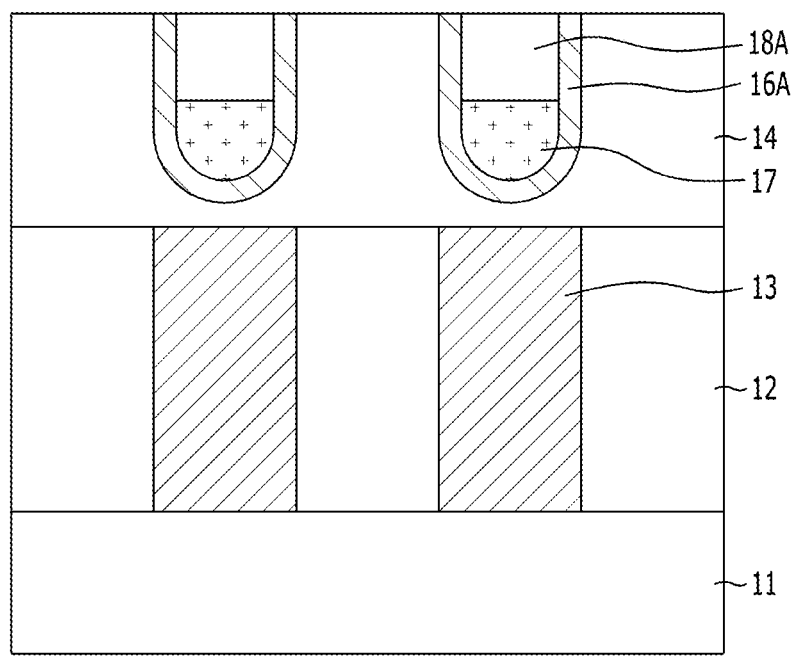
Figure 8:
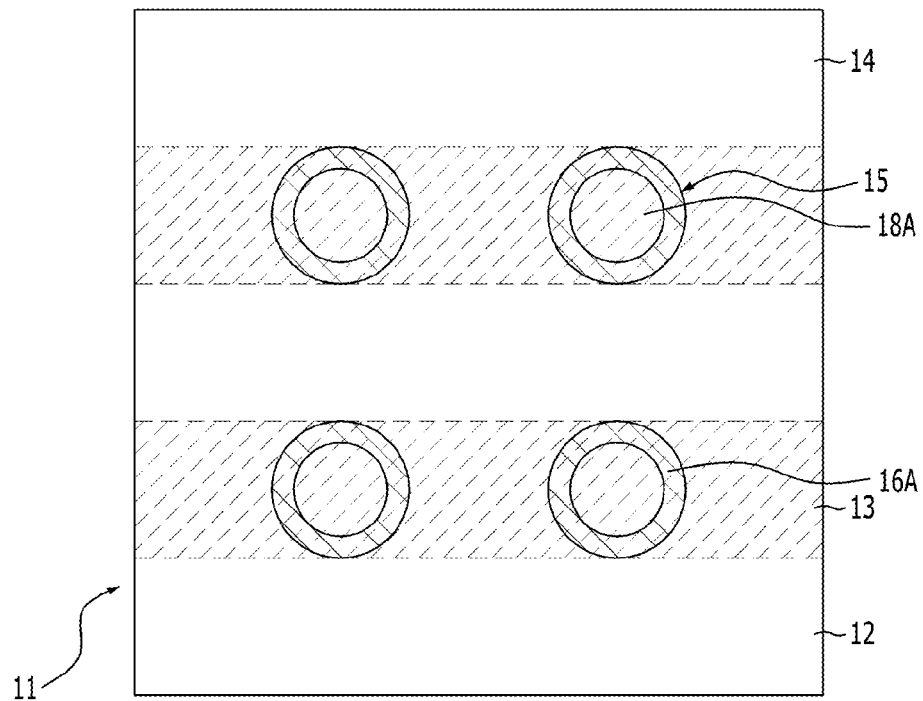

As illustrated in FIGS. 8A and 8B, the conductive material layer 18 and the second metal oxide layer 16 (refer to FIG. 7A) maybe etched to remain only in the trenches 15. As a result, a cell structure, which includes the first metal oxide layer 14, the second metal oxide layer 16A, the selector 17, and the top electrode 18A, is formed. The cell structure may be electrically coupled to the corresponding bottom electrode 13 and the corresponding metal line to be formed.

The conductive material layer 18 and the second metal oxide layer 16 may be etched until a top surface of the first metal oxide 14 is exposed. The etching process may include a planarization process. The planarization process may include a CMP (Chemical Mechanical Polishing) process or etch-back process.

Figure 9A:
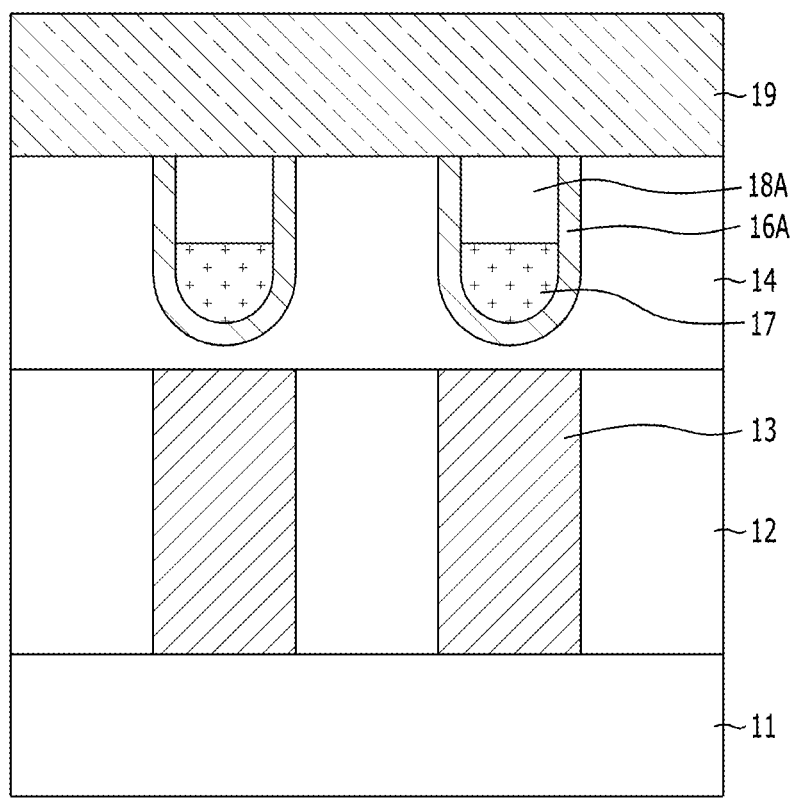
Figure 9B:
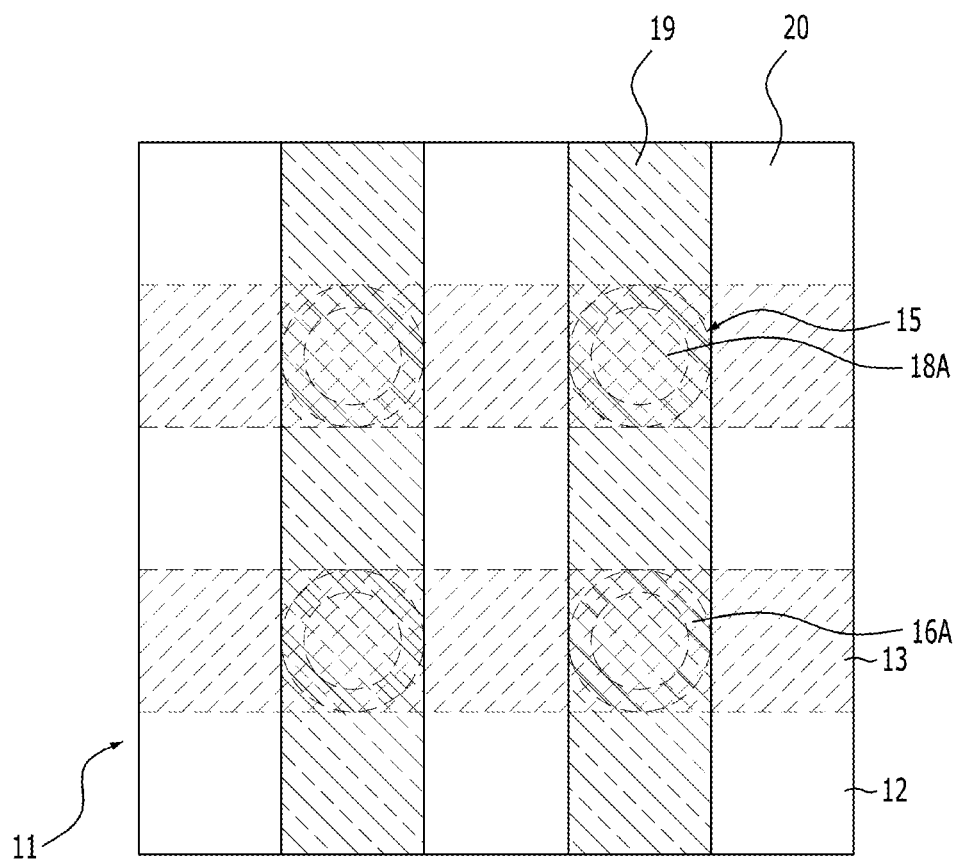

As illustrated in FIGS. 9A and 9B, a plurality of metal lines 19 may be formed to be electrically coupled to the top electrodes 18A.

The metal lines 19 may include a plurality of conductive lines extending in the second direction and arranged at predetermined intervals from each other. A second interlayer dielectric layer 20 may be formed between the metal lines 19 to separate the metal lines 19 from each other. The second interlayer dielectric layer 20 may include the same material as the first interlayer dielectric layer 12.

In accordance with the implementations, an electronic device including a semiconductor memory and a method for fabricating the same can improve characteristics of a variable resistance element.

The above and other memory circuits or semiconductor devices based on the disclosed technology can be used in a range of devices or systems. FIGS. 10-14 provide some examples of devices or systems that can implement the memory circuits disclosed herein.

Figure 10:
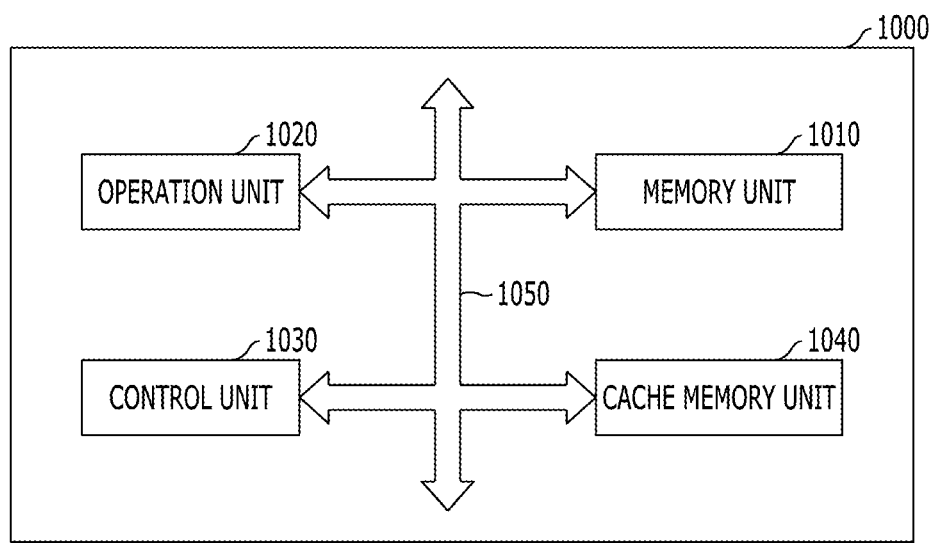
FIG. 10 is an example of configuration diagram of a microprocessor implementing memory circuitry based on the disclosed technology.

FIG. 10 is an example of configuration diagram of a microprocessor implementing memory circuitry based on the disclosed technology.

Referring to FIG. 10, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, a register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a first metal oxide formed over a substrate and including a trench; a second metal oxide formed along the inner wall of the trench; a selector formed over the second metal oxide and buried in a part of the trench; and a top electrode formed over the selector. Through this, a fabrication process of the memory unit 1010 may become easy and the reliability and yield of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 11:
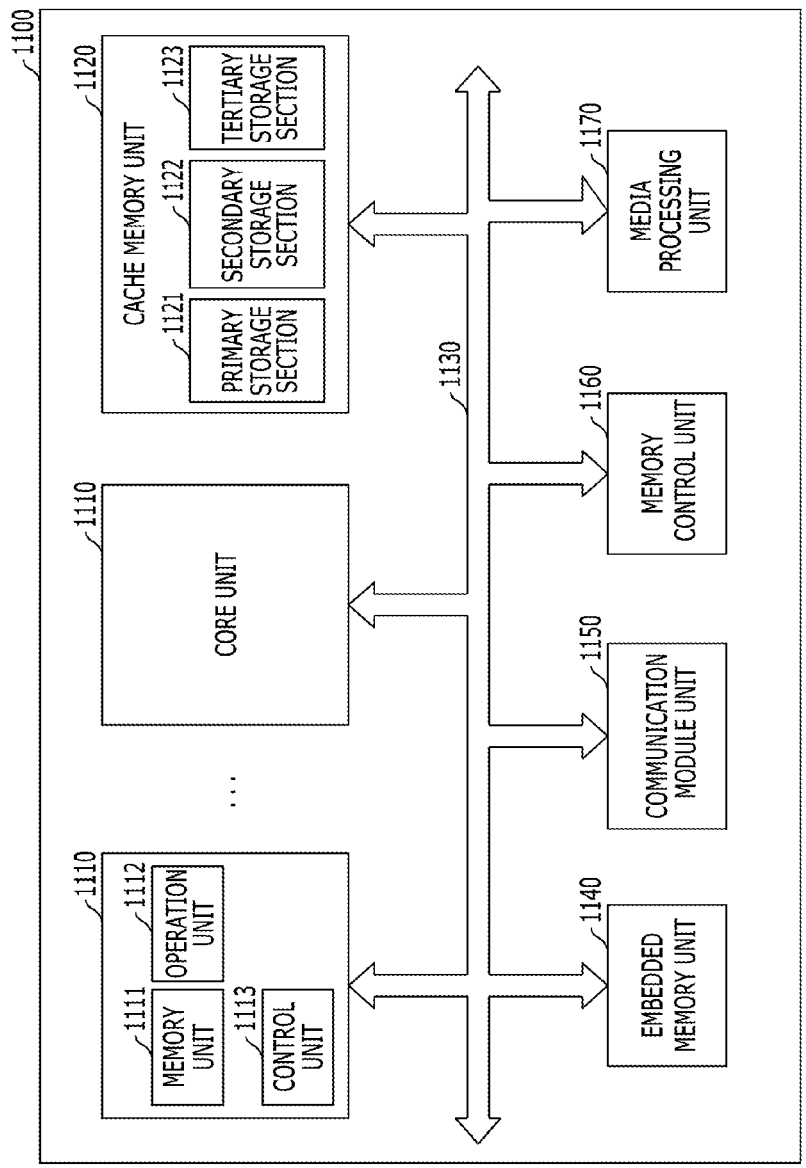
FIG. 11 is an example of configuration diagram of a processor implementing memory circuitry based on the disclosed technology.

FIG. 11 is an example of configuration diagram of a processor implementing memory circuitry based on the disclosed technology.

Referring to FIG. 11, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first metal oxide formed over a substrate and including a trench; a second metal oxide formed along the inner wall of the trench; a selector formed over the second metal oxide and buried in a part of the trench; and a top electrode formed over the selector. Through this, a fabrication process of the cache memory unit 1120 may become easy and the reliability and yield of the cache memory unit 1120 may be improved. As a consequence, operating characteristics of the processor 1100 may be improved.

Although it was shown in FIG. 11 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 12:
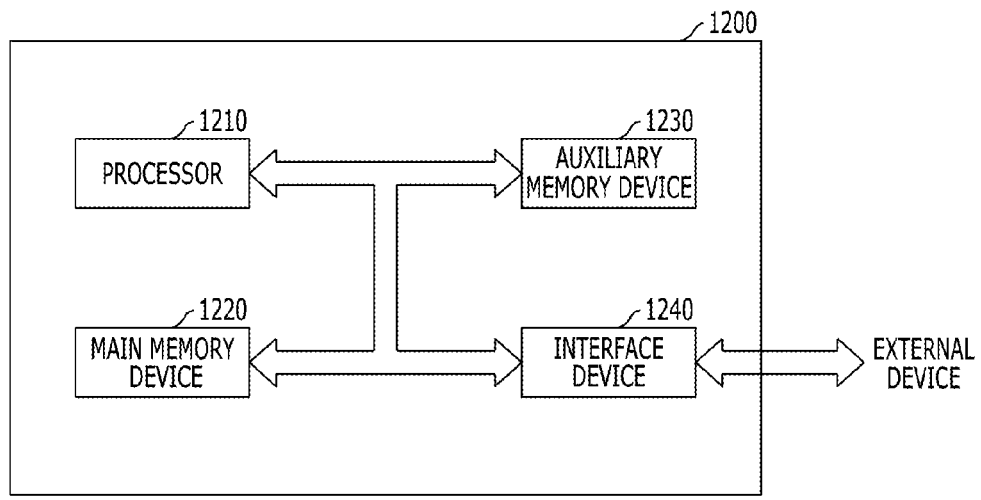
FIG. 12 is an example of configuration diagram of a system implementing memory circuitry based on the disclosed technology.

FIG. 12 is an example of configuration diagram of a system implementing memory circuitry based on the disclosed technology.

Referring to FIG. 12, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a first metal oxide formed over a substrate and including a trench; a second metal oxide formed along the inner wall of the trench; a selector formed over the second metal oxide and buried in a part of the trench; and a top electrode formed over the selector. Through this, a fabrication process of the main memory device 1220 may become easy and the reliability and yield of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a first metal oxide formed over a substrate and including a trench; a second metal oxide formed along the inner wall of the trench; a selector formed over the second metal oxide and buried in a part of the trench; and a top electrode formed over the selector. Through this, a fabrication process of the auxiliary memory device 1230 may become easy and the reliability and yield of the auxiliary memory device 1230 may be improved. As a consequence, operating characteristics of the system 1200 may be improved.

Also, the auxiliary memory device 1230 may further include a data storage system (see the reference numeral 1300 of FIG. 13) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 13) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 13:
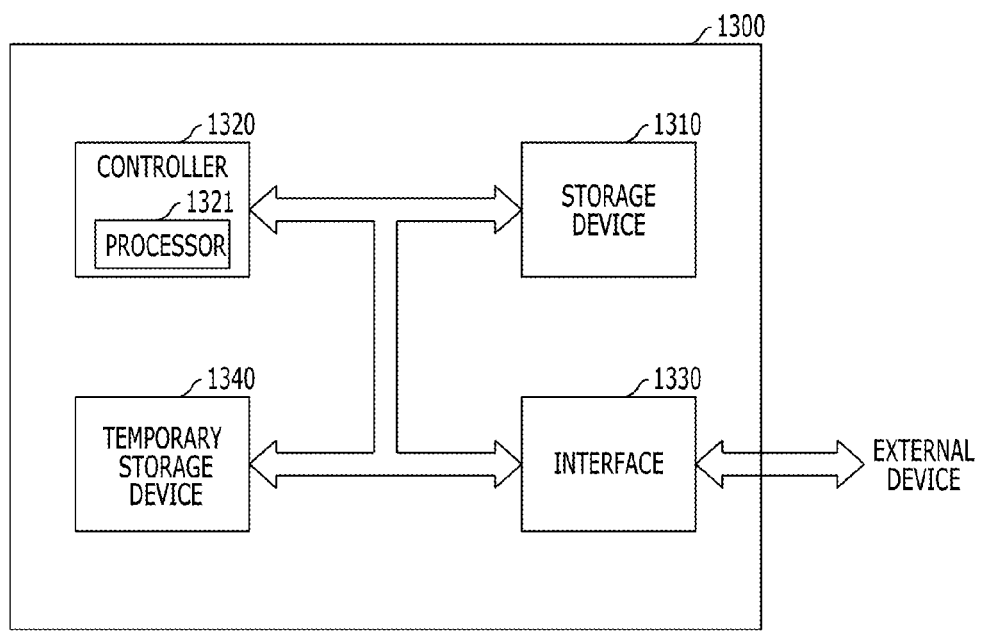
FIG. 13 is an example of configuration diagram of a data storage system implementing memory circuitry based on the disclosed technology.

FIG. 13 is an example of configuration diagram of a data storage system implementing memory circuitry based on the disclosed technology.

Referring to FIG. 13, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a first metal oxide formed over a substrate and including a trench; a second metal oxide formed along the inner wall of the trench; a selector formed over the second metal oxide and buried in a part of the trench; and a top electrode formed over the selector. Through this, a fabrication process of the storage device 1310 or the temporary storage device 1340 may become easy and the reliability and yield of the storage device 1310 or the temporary storage device 1340 may be improved. As a consequence, operating characteristics and data storage characteristics of the data storage system 1300 may be improved.

Figure 14:
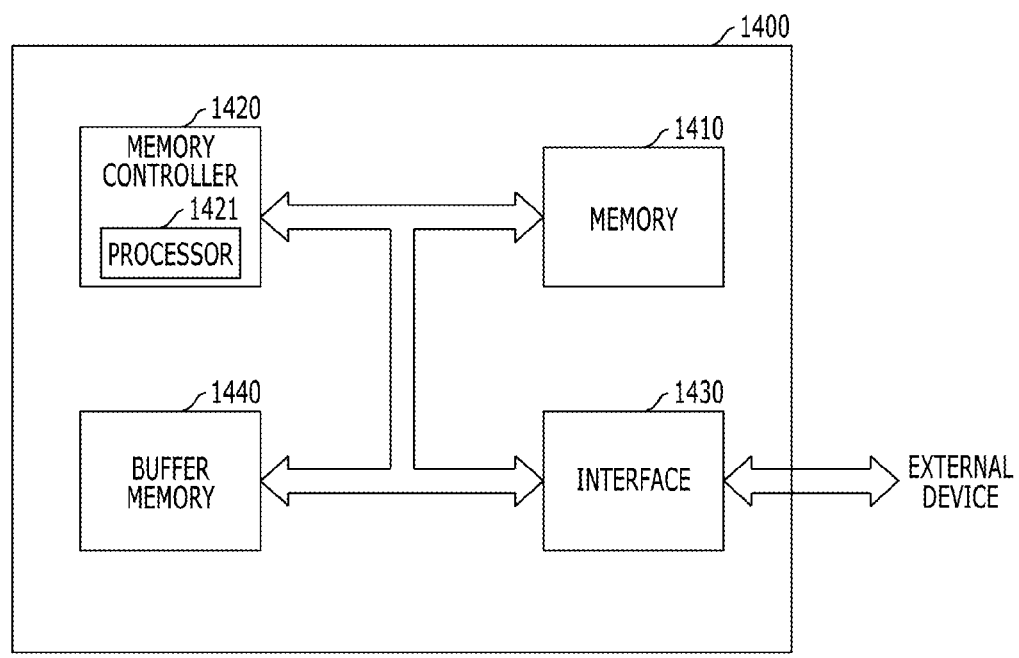
FIG. 14 is an example of configuration diagram of a memory system implementing memory circuitry based on the disclosed technology.

FIG. 14 is an example of configuration diagram of a memory system implementing memory circuitry based on the disclosed technology.

Referring to FIG. 14, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first metal oxide formed over a substrate and including a trench; a second metal oxide formed along the inner wall of the trench; a selector formed over the second metal oxide and buried in a part of the trench; and a top electrode formed over the selector. Through this, a fabrication process of the memory 1410 may become easy and the reliability and yield of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first metal oxide formed over a substrate and including a trench; a second metal oxide formed along the inner wall of the trench; a selector formed over the second metal oxide and buried in a part of the trench; and a top electrode formed over the selector. Through this, a fabrication process of the buffer memory 1440 may become easy and the reliability and yield of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 10-14 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory,
   wherein the semiconductor memory comprises:
   a first metal oxide layer disposed over a substrate and including a trench therein;
   a second metal oxide layer disposed along an inner wall of the trench;
   a selector disposed over the second metal oxide layer and buried in a part of the trench; and
   a top electrode disposed over the selector.

2. The electronic device of claim 1, wherein the first metal oxide layer comprises a material having lower thermal conductivity than the selector.

3. The electronic device of claim 1, wherein the first and second metal oxide layers have different oxygen contents from each other.

4. The electronic device of claim 1, wherein the first metal oxide layer satisfies a stoichiometric ratio.

5. The electronic device of claim 1, wherein the first metal oxide layer comprises any one of titanium oxide, tantalum oxide, hafnium oxide, nickel oxide, and a combination thereof.

6. The electronic device of claim 1, wherein the second metal oxide layer contains an insufficient amount of oxygen with respect to a stoichiometric ratio.

7. The electronic device of claim 1, wherein the second metal oxide layer comprises tantalum oxide or titanium oxide.

8. The electronic device of claim 1, wherein the selector comprises MIT (Metal Insulator Transition) or OTS (Ovonic Threshold Switch).

9. The electronic device of claim 1, wherein the selector comprises niobium oxide or vanadium oxide.

10. The electronic device of claim 1, wherein the semiconductor memory further comprises an anti-diffusion layer or an intermediate electrode disposed between the second metal oxide layer and the selector.

11. The electronic device of claim 10, wherein the anti-diffusion layer comprises a material layer containing carbon.

12. The electronic device of claim 10, wherein the intermediate electrode comprises metal nitride.

13. The electronic device of claim 1, wherein the top electrode comprises metal nitride.

14. The electronic device of claim 1, wherein the semiconductor memory further comprises a bottom electrode disposed between the substrate and the first metal oxide layer, and
   wherein the bottom electrode comprises a plurality of conductive lines extending in a first direction and arranged at predetermined intervals from each other.

15. The electronic device of claim 1, wherein the semiconductor memory further comprises:
   a bottom electrode disposed between the substrate and the first metal oxide layer; and
   a metal line disposed over the top electrode and the first and second metal oxide layers,
   wherein the metal line comprises a plurality of conductive lines extending in a second direction crossing the bottom electrode and arranged at predetermined intervals from each other.

16. The electronic device of claim 1, wherein the semiconductor memory further comprises:
   a bottom electrode disposed between the substrate and the first metal oxide layer; and
   a metal line disposed over the top electrode and the first and second metal oxide layers,
   wherein the trench has a hole type, and is disposed in a region where the bottom electrode and the metal line cross each other.

17. A method for fabricating an electronic device including a semiconductor memory, the method comprising:
   forming a first metal oxide layer over a substrate;
   forming a trench in the first metal oxide layer by partially etching the first metal oxide layer;

forming a second metal oxide layer along an inner wall of the trench;

forming a selector over the second metal oxide layer by filling a part of the trench; and forming a top electrode over the selector.

18. The method of claim 17, wherein the first metal oxide layer comprises a metal having lower thermal conductivity than the selector.

19. The method of claim 17, wherein the first and second metal oxide layers have different oxygen contents from each other.

20. The method of claim 17, wherein the first metal oxide layer satisfies a stoichiometric ratio.

21. The method of claim 17, wherein the first metal oxide layer comprises any one of titanium oxide, tantalum oxide, hafnium oxide, nickel oxide, and a combination thereof.

22. The method of claim 17, wherein the second metal oxide layer contains an insufficient amount of oxygen with respect to a stoichiometric ratio.

23. The method of claim 17, wherein the second metal oxide layer comprises tantalum oxide or titanium oxide.

24. The method of claim 17, wherein the selector comprises MIT and OTS.

25. The method of claim 17, further comprising forming an anti-diffusion layer between the second metal oxide layer and the selector, before forming the selector.

26. The method of claim 17, further comprising forming an intermediate electrode between the second metal oxide layer and the selector, before forming the selector.

* * * * *